US009444026B2

(12) United States Patent
Backhaus-Ricoult et al.

(10) Patent No.: US 9,444,026 B2
(45) Date of Patent: *Sep. 13, 2016

(54) REDUCED OXIDES HAVING LARGE THERMOELECTRIC ZT VALUES

(71) Applicant: Corning Incorporated, Corning, NY (US)

(72) Inventors: Monika Backhaus-Ricoult, Horseheads, NY (US); Lisa Anne Moore, Corning, NY (US); Charlene Marie Smith, Corning, NY (US); Todd Parrish St Clair, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 46 days.

This patent is subject to a terminal disclaimer.

(21) Appl. No.: 14/252,131

(22) Filed: Apr. 14, 2014

(65) Prior Publication Data

US 2014/0225022 A1 Aug. 14, 2014

Related U.S. Application Data

(63) Continuation-in-part of application No. 13/891,581, filed on May 10, 2013, now Pat. No. 9,076,567, which is a continuation-in-part of application No. 13/192,842, filed on Jul. 28, 2011, now Pat. No. 8,628,680.

(51) Int. Cl.
| | |
|---|---|
| *H01L 35/18* | (2006.01) |
| *H01L 35/22* | (2006.01) |
| *C04B 35/47* | (2006.01) |
| *C04B 35/645* | (2006.01) |
| *B82Y 30/00* | (2011.01) |

(52) U.S. Cl.
CPC ............ *H01L 35/22* (2013.01); *B82Y 30/00* (2013.01); *C04B 35/47* (2013.01); *C04B 35/645* (2013.01); *C04B 2235/3224* (2013.01); *C04B 2235/3225* (2013.01); *C04B 2235/3227* (2013.01); *C04B 2235/3229* (2013.01); *C04B 2235/3237* (2013.01); *C04B 2235/3251* (2013.01); *C04B 2235/3813* (2013.01); *C04B 2235/3843* (2013.01); *C04B 2235/3886* (2013.01); *C04B 2235/5436* (2013.01); *C04B 2235/5445* (2013.01); *C04B 2235/5454* (2013.01); *C04B 2235/652* (2013.01); *C04B 2235/656* (2013.01); *C04B 2235/658* (2013.01); *C04B 2235/6562* (2013.01); *C04B 2235/6567* (2013.01); *C04B 2235/6587* (2013.01); *C04B 2235/666* (2013.01); *C04B 2235/77* (2013.01); *C04B 2235/785* (2013.01); *C04B 2235/79* (2013.01); *C04B 2235/80* (2013.01); *C04B 2235/9607* (2013.01)

(58) Field of Classification Search
CPC ...................................................... H01L 35/22
See application file for complete search history.

(56) References Cited

U.S. PATENT DOCUMENTS

| | | | |
|---|---|---|---|
| 7,670,711 B2 | 3/2010 | Marina et al. | |
| 8,628,680 B2 * | 1/2014 | Backhaus-Ricoult | .. C04B 35/47 |
| | | | 136/238 |
| 9,076,567 B2 * | 7/2015 | Backhaus-Ricoult | ... H01B 1/02 |
| 2004/0265669 A1 | 12/2004 | Yoo et al. | |
| 2005/0250000 A1 | 11/2005 | Marina et al. | |
| 2006/0210864 A1 | 9/2006 | Eguchi et al. | |

FOREIGN PATENT DOCUMENTS

WO 2008109564 A1 9/2008

OTHER PUBLICATIONS

Muta, et.al "Thermoelectric properties of rare earth doped SrTiO3" J. Alloys and Compounds 350 (2003) 292-295.
Muta, et. al "Thermoelectric properties of doped BaTiO3-SrTiO3 solid solutions" J. Alloys and Compounds 368 (2004) 22-24.
Wang, et. al "Substitution effect on the thermoelectric properties of reduced Nb-doped Sr0.95La0.05TiO3 ceramics" J. Alloys and Compounds 486 (2009) 693-696.
Ohta, et al "Grain size dependence of thermoelectric performance of Nb-doped SrTiO3 polycrystals" J. Ceram. Soc. Japan 114 (2006) 102-105.
Q.X. Fu et al; "Ceramic-Based Anode Materials for Improved Redox Cycling of Solid Oxide Fuel Cells"; Fuel Cells 08 2008 No. 5, 283-293.
Q.X. Fur et al; "Influence of Sintering Conditions on Microstructure and Electrical Conductivity of Yttrium-Substituted SrTiO3"; Journal of the European Ceramic Society 28 (2008) 811-823.
Marina et al; "Thermal, Electrical, and Electrocatalytical Properties of Lanthanum-Doped Strontium Titanate"; Solid State Ionics 149 (2002) 21-28.
Sun et al; "Yttrium-Doped Effect on Thermoelectric Properties of $La_{0.1}Sr_{0.9}TiO_3$ Ceramics"; J Mater Sci (2011) 46: 5278-5281.
PCT/US2012/046834 Search Report.

* cited by examiner

*Primary Examiner* — Carol M Koslow
(74) *Attorney, Agent, or Firm* — Gregory V. Bean

(57) ABSTRACT

Doped and partially-reduced oxide (e.g., $SrTiO_3$-based) thermoelectric materials. The thermoelectric materials can be single-doped or multi-doped (e.g., co-doped) and display a thermoelectric figure of merit (ZT) of 0.2 or higher at 1050 K. Methods of forming the thermoelectric materials involve combining and reacting suitable raw materials and heating them in a graphite environment to at least partially reduce the resulting oxide. Optionally, a reducing agent such as lanthanum boride, titanium carbide, titanium nitride, or titanium boride can be incorporated into the starting materials prior to the reducing step in graphite. The reaction product can be sintered to form a dense thermoelectric material.

15 Claims, 10 Drawing Sheets

US 9,444,026 B2

REDUCED OXIDES HAVING LARGE THERMOELECTRIC ZT VALUES

CROSS-REFERENCE TO RELATED APPLICATIONS

This application is a continuation-in-part of U.S. application Ser. No. 13/891,581, filed May 10, 2013, U.S. Pat. No. 9,076,567, which is a continuation-in-part of U.S. application Ser. No. 13/192,842, filed Jul 28, 2011, U.S. Pat. No. 8,628,680, the contents of which are relied upon and incorporated herein by reference in its entirety, and the benefit of priority under 35 U.S.C. §120 is hereby claimed.

BACKGROUND

The present disclosure relates to thermoelectric materials that can be used in thermoelectric devices for electric power generation, and more particularly to partially-reduced, doped oxides that have a high thermoelectric figure of merit.

Thermoelectric materials can be used to generate electricity when exposed to a temperature gradient according to the thermoelectric effect. Notably, a thermoelectric device such as a thermoelectric power generator can be used to produce electrical energy, and advantageously can operate using waste heat such as industrial waste heat generated in chemical reactors, incineration plants, iron and steel melting furnaces, and in automotive exhaust. Efficient thermoelectric devices can recover about 5% or more of the heat energy released by such industrial systems, though due to the "green nature" of the energy, lower efficiencies are also of interest. Compared to other power generators, thermoelectric power generators operate without toxic gas emission, and with longer lifetimes and lower operating and maintenance costs.

The conversion of thermal energy into electrical energy is based on the Seebeck effect, a phenomenon that describes the formation of an electrical potential in a material that is exposed to a thermal gradient. The Seebeck voltage, $\Delta U$, also referred to as the thermopower or thermoelectric power of a material, is the induced thermoelectric voltage in response to a temperature difference across that material. The Seebeck coefficient S is defined as the limit of that thermoelectric voltage when the temperature gradient goes to zero, $$S = \lim \frac{\Delta U}{\nabla T}$$

and has units of $VK^{-1}$, though typical values are in the range of microvolts per Kelvin.

A thermoelectric device typically includes two types of semiconducting material (e.g., n-type and p-type) though thermoelectric devices comprising a single thermoelectric material (either n-type or p-type) are also known. Conventionally, both n-type and p-type conductors are used to form n-type and p-type elements within a device. In a typical device, alternating n-type and p-type elements are electrically connected in series and thermally connected in parallel between electrically insulating but thermally conducting plates. Because the equilibrium concentration of carriers in a semiconductor is a function of temperature, a temperature gradient in the material causes carrier migration. The motion of charge carriers in a device comprising n-type and p-type elements will create an electric current.

For purely p-type materials that have only positive mobile charge carriers (holes), S>0. For purely n-type materials that have only negative mobile charge carriers (electrons), S<0. In practice, materials often have both positive and negative charge carriers, and the sign of S usually depends on which carrier type predominates.

The maximum efficiency of a thermoelectric material depends on the amount of heat energy provided and on materials properties such as the Seebeck coefficient, electrical conductivity and thermal conductivity. A figure of merit, ZT, can be used to evaluate the quality of thermoelectric materials. ZT is a dimensionless quantity that for small temperature differences is defined by $ZT=\sigma S^2 T/\kappa$, where $\sigma$ is the electric conductivity, S is the Seebeck coefficient, T is temperature, and $\kappa$ is the thermal conductivity of the material. Another indicator of thermoelectric material quality is the power factor, $PF=\sigma S^2$.

A material with a large figure of merit will usually have a large Seebeck coefficient (found in low carrier concentration semiconductors or insulators) and a large electrical conductivity (found in high carrier concentration metals).

Good thermoelectric materials are typically heavily-doped semiconductors or semimetals with a carrier concentration of $10^{19}$ to $10^{21}$ carriers/cm$^3$. Moreover, to ensure that the net Seebeck effect is large, there should only be a single type of carrier. Mixed n-type and p-type conduction will lead to opposing Seebeck effects and lower thermoelectric efficiency. In materials having a sufficiently large band gap, n-type and p-type carriers can be separated, and doping can be used to produce a dominant carrier type. Thus, good thermoelectric materials typically have band gaps large enough to have a large Seebeck coefficient, but small enough to have a sufficiently high electrical conductivity. The Seebeck coefficient and the electrical conductivity are inversely related parameters, however, where the electrical conductivity is proportional to the carrier density (n) while the Seebeck coefficient scales with $3n^{-2/3}$.

Further, a good thermoelectric material advantageously has a low thermal conductivity. Thermal conductivity in such materials comes from two sources. Phonons traveling through the crystal lattice transport heat and contribute to lattice thermal conductivity, and electrons (or holes) transport heat and contribute to electronic thermal conductivity.

One approach to enhancing ZT is to minimize the lattice thermal conductivity. This can be done by increasing phonon scattering, for example, by introducing heavy atoms, disorder, large unit cells, clusters, rattling atoms, grain boundaries and interfaces.

Previously-commercialized thermoelectric materials include bismuth telluride- and (Si, Ge)-based materials. The family of $(Bi,Pb)_2(Te,Se,S)_3$ materials, for example, has a figure of merit in the range of 1.0-1.2. Slightly higher values can be achieved by selective doping, and still higher values can be reached for quantum-confined structures. However, due to their lack of chemical stability and low melting point, the application of these materials is limited to relatively low temperatures (<450° C.), and even at such relatively low temperatures, they require protective surface coatings. Other known classes of thermoelectric materials such as clathrates, skutterudites and silicides also have limited applicability to elevated temperature operation.

In view of the foregoing, it would be advantageous to develop thermoelectric materials (e.g., n-type and/or p-type) capable of efficient operation at elevated temperatures. More specifically, it would be advantageous to develop environmentally-friendly, high-temperature thermoelectric materials having a high figure of merit in the medium-to-high temperature range, e.g., above 450° C.

SUMMARY

These and other aspects and advantages can be achieved by a family of doped oxide materials that are at least partially reduced during their synthesis. The classes of oxides can include $SrTiO_3$-based materials, including bulk, polycrystalline materials having the general formula $(Sr_{1-x}, D1_x)_{1-z}(Ti_{1-y}D2_y)Ti_zO_{3-m}$, where D1 and D2 each represent one or more dopant atoms (e.g., Ca, Ce, Nb, Ta, La, Y and other rare earth elements and alkaline earth elements). The effects of co-doping, e.g., Ca and Nb co-doping, excess titanium, and second phase additions are disclosed.

Reduction can be accomplished by heating and reacting suitable raw materials in a reducing environment (e.g., graphite environment). A complimentary reduction approach involves incorporating into the raw materials a reducing agent such as titanium carbide, titanium nitride, or titanium boride, e.g., in the form of particles. The mixture is then heated and reacted to produce a partially-reduced oxide thermoelectric material. The resulting material can be sintered into dense elements using, for example, spark plasma sintering. Using such an approach, the fraction of thermal conductivity due to the lattice component can be reduced from over 97 percent to less than 75 percent, and the thermoelectric material can exhibit ZT values of about 0.2 or higher (e.g., about 0.33) at 1050K. Example dopants can be incorporated separately or in combination. Thus, embodiments include co-doped $SrTiO_3$ materials.

The disclosed $SrTiO_3$-based materials can be incorporated into a thermoelectric device. An exemplary method for forming such materials includes combining raw materials to form a mixture, surrounding the mixture with graphite, and heating the mixture to form a partially-reduced thermoelectric oxide material.

Additional features and advantages will be set forth in the detailed description which follows, and in part will be readily apparent to those skilled in the art from that description, including the detailed description which follows, the claims, as well as the appended drawings.

It is to be understood that both the foregoing general description and the following detailed description present embodiments, and are intended to provide an overview or framework for understanding the nature and character of the disclosure as it is claimed. The accompanying drawings are included to provide a further understanding, and are incorporated into and constitute a part of this specification. The drawings illustrate various embodiments and together with the description serve to explain the principles and operations of the various embodiments.

DETAILED DESCRIPTION

Figure 1:
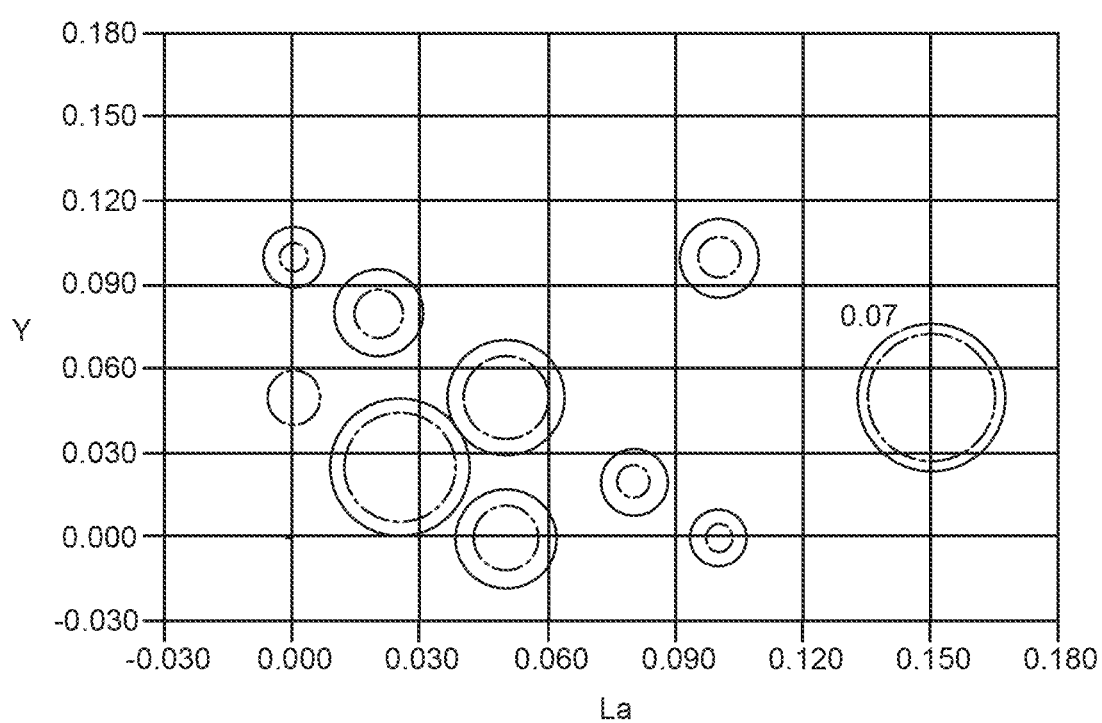
FIG. 1 shows thermoelectric figure of merit values as a function of Y- and/or La-doping in comparative, unreduced $SrTiO_3$-based materials.

The disclosure relates generally to high temperature thermoelectric materials and methods of making such materials. The inventive materials are doped and partially-reduced oxides optionally comprising a second phase. According to embodiments, nanoscale lanthanum boride ($LaB_6$), lanthanum aluminum oxide ($LaAlO_3$), yttrium aluminum oxide ($Y_3Al_5O_{12}$), niobium carbide (NbC), titanium carbide (TiC), titanium nitride (TiN), titanium oxide ($TiO_x$, $x \leq 2$) or titanium boride ($TiB_2$) can be combined with strontium titanate ($SrTiO_3$) raw materials, and the mixture can be heated and reacted under reducing conditions to form the thermoelectric materials. Reduction of the powders prior to sintering increases the power factor ($\sigma S^2$) and ZT with respect to the unreduced material. The addition of a reducing agent (TiC, TiN, $TiB_2$) further increases the power factor while suppressing expected increases in thermal conductivity.

Advantageously, the strontium titanate is at least partially reduced either by reaction with a reducing second phase that is incorporated into precursor materials used to form the strontium titanate, by exposure to reducing conditions during heating or densification, or a combination of both. In embodiments, the inventive thermoelectric material is a composite comprising strontium titanate and/or its sub-stoichiometric phases and at least one second phase. Unless otherwise defined, strontium titanium oxide ($SrTiO_3$) and its various sub-stoichiometric forms are referred to herein collectively as strontium titanate.

In addition to strontium and titanium, additional elements may be incorporated into the disclosed thermoelectric materials and the resulting composition may include, for example, dopants include Ca, Ce, Nb, Ta, La, Y and other rare earth elements, and alkaline earth elements. Such dopant elements, if included, can substitute for Sr and/or Ti on respective cationic lattice sites and/or be incorporated on interstitial sites. Niobium-doping, for example, can create a high concentration of n-type carriers and increases the electronic conductivity by several orders of magnitude. Further, by doping with niobium, metallic-like conduction can be obtained at low oxygen activity while semiconductor behavior prevails at high oxygen activity. In embodiments, the disclosed thermoelectric materials can be co-doped, where two or more dopants are incorporated into the material (e.g., on equivalent or different lattice sites). Dopants may be homovalent or heterovalent with respect to the cation they replace.

In embodiments, the effects of La and Y co-doping and reduction on the high temperature thermoelectric properties of strontium titanate materials were investigated. Bulk, polycrystalline materials having the composition $(Sr_{1-x}D1_x)_{1-y}(Ti_{1-y}D2_y)Ti_zO_{3-m}$, where D1 is La and Y, D2 is Nb, $0 \leq x \leq 0.4$, $0 \leq y \leq 0.4$, $0.025 \leq (x+y) \leq 0.4$, $0 \leq z \leq 0.15$, and $0 \leq m \leq 0.1$ were prepared by powder processing and spark plasma sintering. Reduction of the powders was achieved by two methods: (1) heat treatment of the powders in a graphite bed prior to sintering, or (2) addition of NbC, $LaB_6$, $LaAlO_3$, $Y_3Al_5O_{12}$, TiC, TiN, or $TiB_2$ and heat treatment of the powders in a graphite bed prior to sintering. The use of additives was found to be effective at improving the high temperature ZT by increasing the electrical conductivity without causing large increases in thermal conductivity.

The effect of one or more dopants on the thermoelectric figure of merit is illustrated in FIG. 1, which is a plot of ZT values as a function of La and/or Y doping in unreduced (comparative) $SrTiO_3$ materials at 660K and 1050K. The measured ZT values are represented as circles for different La (x-axis) and Y (y-axis) concentrations. The size of the circles represents the value of ZT for each composition. The 660K data is represented by dashed circles, while the 1050K data is represented by solid circles. Referring to FIG. 1, the largest ZT value is 0.07 at 1050K for $La_{0.15}Y_{0.05}Sr_{0.8}TiO_3$.

Incorporating a single dopant yields the lowest ZT values. On the other hand, the effect of co-doping can be accretive as illustrated by comparing the increase in the ZT values for $La_xY_ySr_{0.9}TiO_3$ where x=0.05; y=0.05 relative to the singly doped compositions $D_{0.1}Sr_{0.9}TiO_3$ (D=dopant=La or Y).

Two trends are apparent with La and Y. First, for a 1:1 ratio of La:Y, ZT is larger nearer the origin, indicating that a lower total concentration of dopants may be preferred. However, ZT can be increased further when the dopants are included in non-equal amounts. Illustrative of this is the trend at constant Y=0.05 with increasing La, where the highest ZT is achieved with La=0.15. Example doped alloys include $La_{0.15}Y_{0.05}Ca_xSr_{0.8-x}TiO_{3-\delta}$, co-doped alloys such as $(La,Y)_xSr_{1-x}Nb_yTi_{1-y}O_{3-\delta}$ and doped alloys that contain excess Ti such as $(La_{0.15}Y_{0.05}Sr_{0.8})_{1-y}Ti_{1+y}O_{3-\delta}$.

In view of the foregoing observed trends between doping composition(s) and the figure of merit, doped materials were reduced via (a) a heat treatment using a graphite environment, or (b) mixing the precursor materials first with 5 wt. % nano-scale titanium carbide (or other reducing agent) followed by a heat treatment using a graphite environment.

Figure 2:
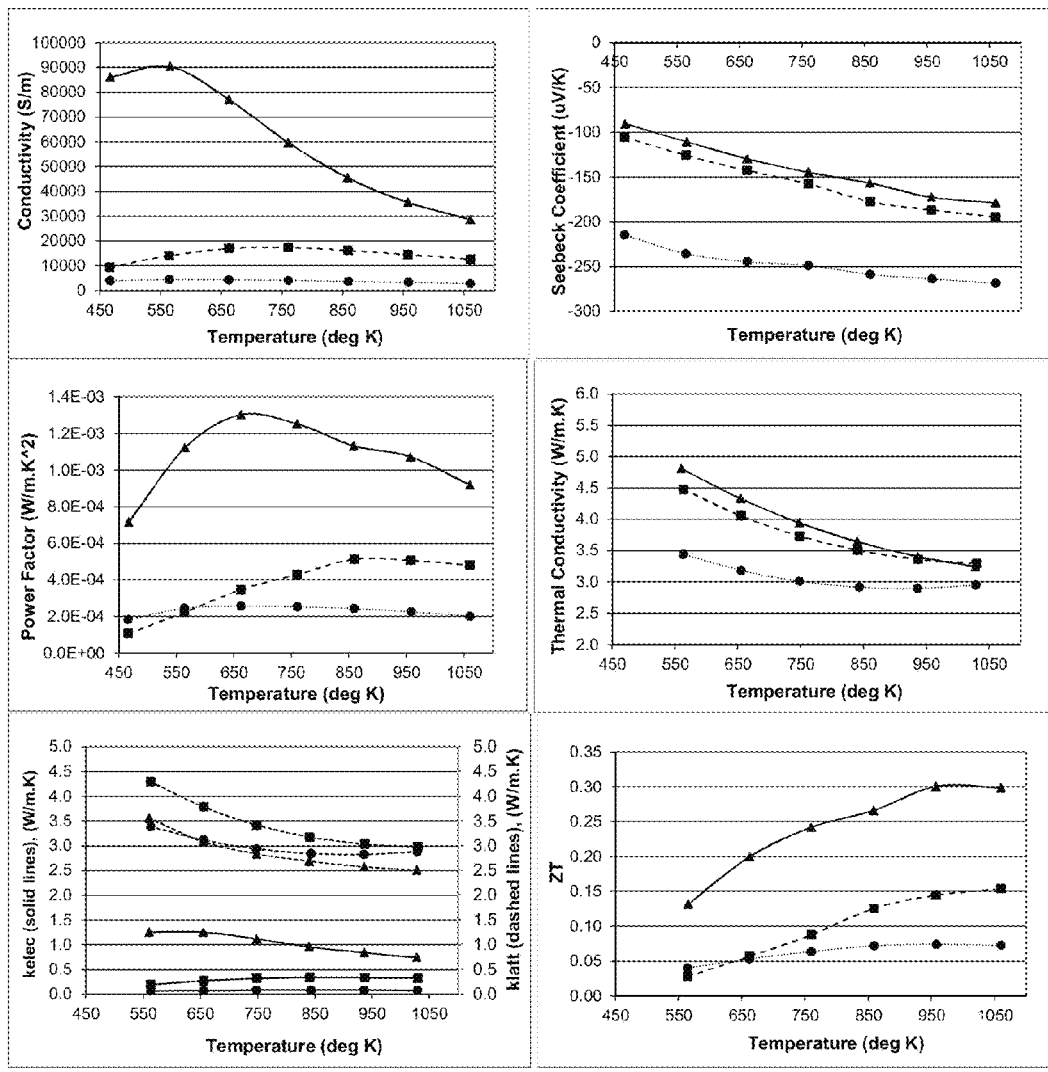
FIG. 2 shows plots of thermoelectric for comparative and example $SrTiO_3$-based thermoelectric materials.

The graphite heat treatment can be carried out at any suitable temperature for any effective time. The data in FIG. 2 represent samples reduced using heat treatments at 1400° C. for 6 hours, though the heat treatment can be performed at 1200, 1250, 1300, 1350, 1400, 1450, 1500, 1550, 1600, 1650, 1700, 1750 or 1800° C. for a period of time ranging from 0.5 to 12 hours. In the graphite reduction, samples of the thermoelectric material to be reduced are buried within a bed of graphite powder within a suitable furnace. In an embodiment, the precursor materials can be sintered at elevated temperature (e.g., at least 900° C., 1200° C. or 1400° C.) in air or in a high oxygen partial pressure environment prior to the reducing treatment in order to form the $SrTiO_3$ phase. In addition to the $SrTiO_3$ phase formation, such a pre-treatment at elevated temperature in air or a high oxygen partial pressure environment can preferentially form a high concentration of point defects (e.g., oxygen vacancies and cationic carriers of niobium or titanium), which can be retained in the solid state upon cooling and ultimately benefit the thermoelectric properties of the resulting thermoelectric material.

In a complimentary approach, the thermoelectric material to be reduced can be mixed with a reducing agent such as titanium carbide. Titanium carbide is an example of a half-metal conducting phase that crystallizes in the rock salt structure and exhibits a wide range of stoichiometry. The composition of titanium carbide, for example, can vary as expressed by the chemical formula, $TiC_x$ ($0.6 < x < 1$). According to embodiments, the TiC (or TiN, or $TiB_2$) powder can have a crystallite size and/or particle size of around 200 nm (e.g., from 1 to 500 nm).

Although titanium carbide is a relatively poor thermoelectric material, it has a high electrical conductivity and can contribute to the electrical conductivity when incorporated into a composite thermoelectric material. The thermal conductivity of titanium carbide at room temperature is on the order of about 20 W/mK. In embodiments, a reducing step was performed by first mixing the precursor materials with 5 wt. % nano-scale titanium carbide and then heat treating the composite material using a graphite environment. Although experiments were performed using 5 wt. % TiC, the amount of TiC incorporated into the precursor materials can range from about 0.25 to 10 wt. %. In further embodiments, a reducing step was performed by first heat treating the precursor materials using a graphite environment and then incorporating into the thermoelectric material a material such as titanium carbide. Subsequent heat treating accomplished during sintering can affect a mild reduction.

In the disclosed strontium titanate-titanium carbide composites, the intrinsic oxygen activity is low due to the co-existence of the oxide with the carbide. As a result, the electrical conductivity of the composite material is higher than the electrical conductivity of the oxide without any second (TiC) phase. In embodiments, the overall electrical conductivity of the composite is high due to contributions from both phases. In further embodiments, incorporation into the precursor materials of TiC can decrease the lattice thermal conductivity of the resulting thermoelectric composite relative to a single phase system.

Thus, embodiments of the disclosure relate to a reduced (e.g., partially-reduced), doped material. The reduction can be accomplished with or without the use of a reducing agent. A reducing agent, such as TiC, if used, has been demonstrated to yield a higher overall ZT value than that obtained following reduction without such a reducing agent.

The effect of the reducing treatments on the electrical conductivity, Seebeck coefficient, power factor, thermal conductivity, and ZT for an example $La_{0.15}Y_{0.05}Sr_{0.8}TiO_3$ alloy is illustrated in FIG. 2. Throughout FIG. 2, the filled circles represent calcined but unreduced (i.e., comparative) samples, the squares represent samples reduced using a heat treatment at 1400° C. for 6 hours in graphite, and the triangles represent samples reduced by first incorporating 5 wt. % nano-scale titanium carbide into the thermoelectric material composition and then heat treating at 1400° C. for 6 hours in graphite.

The sample exhibiting the highest power factor was made by incorporating 5 wt. % nano-TiC into the alloy and then heat treating at 1400° C. for 6 hours in graphite. Its low temperature thermal conductivity is only slightly higher than the 'reduced only' sample while at higher (closer to use) temperatures its thermal conductivity is comparable.

The nano TiC+heat treated sample has a ZT value of about 0.3 at 1050K. The large increase in electrical conductivity for the nano TiC-containing sample, relative to the heat-treated only sample is unique in that the magnitude of its Seebeck coefficient is not significantly decreased nor is its thermal conductivity significantly increased.

The thermal conductivity data can be examined using the Wiedemann-Franz law that states that the ratio of a metal's electronic component of thermal conductivity to its total electrical conductivity is proportional to temperature according to $\kappa_{elec}/\sigma=LT$, where L is the Lorenz Number for free electrons. For free electrons, L has a value of $2.44\times10^{-8}$ W/SK$^2$. Using the Wiedemann-Franz law and the assumptions inherent in it, the electron contribution of $\kappa$ can be calculated from measured properties. Since the thermal conductivity is the sum of electron and lattice components, the value of the lattice thermal conductivity can determined from the difference. For thermoelectric applications, it is generally advantageous to decrease the lattice component of the thermal conductivity, as most of the heat is carried by this mechanism. Furthermore, decreasing the lattice component of an electrically conducting material effectively breaks the connection between electrical conductivity and (total) thermal conductivity and allows for independent tailoring of the components to maximize ZT.

Also shown in FIG. 2 are the electronic and lattice components to the thermal conductivity for the three samples. It is noteworthy that the lattice thermal conductivity for the reduced samples (graphite heat-treated and, in particular, nano TiC-containing with graphite heat treatment) is comparable to the lattice thermal conductivity of the calcined-only sample, suggesting that reduction and reduction in the presence of nano-TiC can be useful in decreasing the lattice component, perhaps by increasing the number of defects in the material.

Figure 3:
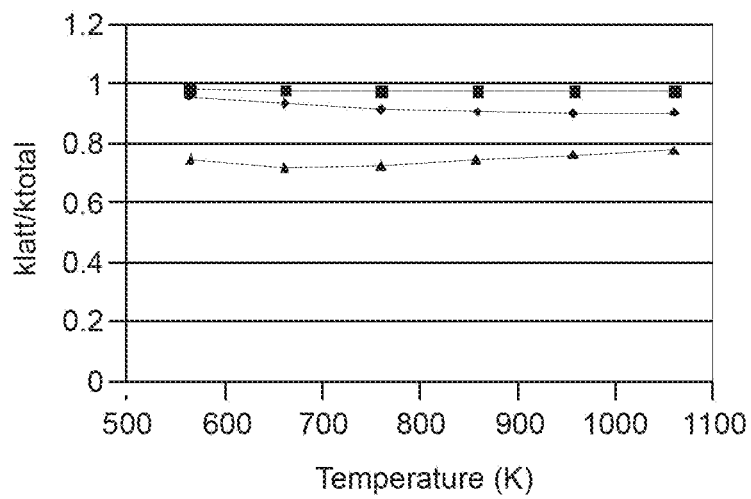
FIG. 3 is a plot of the fraction of the lattice component of the thermal conductivity to the total thermal conductivity for comparative and example $SrTiO_3$-based thermoelectric materials.
Figure 4:
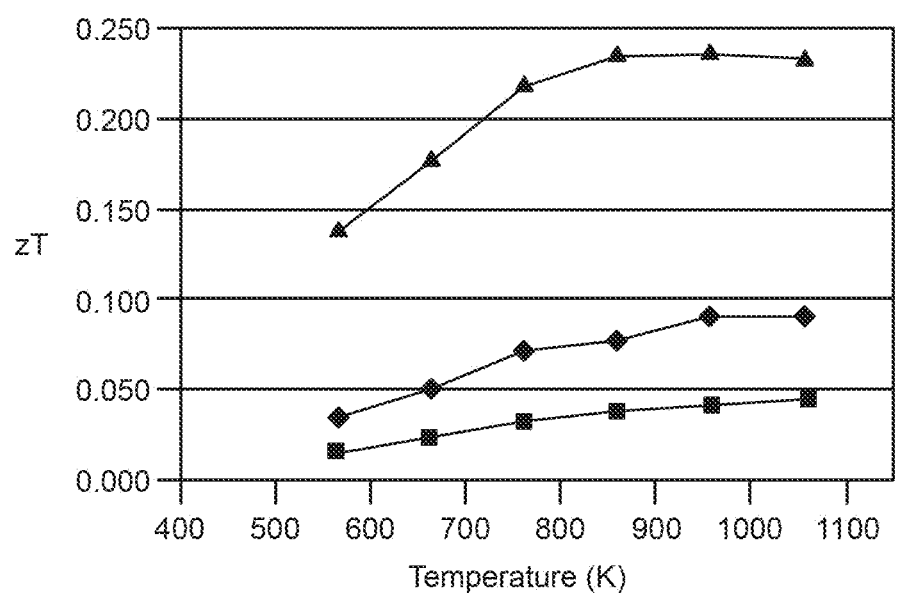
FIG. 4 is a plot of ZT versus temperature for further comparative and example $SrTiO_3$-based thermoelectric materials.

This point is further illustrated with reference to FIG. 3, which is a plot of the fraction of lattice component of the thermal conductivity to the total thermal conductivity for the three samples of FIG. 2. The plot shows that for the calcined-only material (squares), over 97% of its thermal conductivity is due to the lattice component. For the graphite-reduced (diamonds) and the TiC-containing and then graphite-reduced samples (triangles), this fraction is about 90% and about 70%, respectively, depending on the measurement temperature.

Throughout FIGS. 3-6, the filled squares represent calcined but unreduced (i.e., comparative) samples, the diamonds represent samples reduced using a heat treatment at 1400° C. for 6 hours in graphite, and the triangles represent samples reduced by first incorporating 5 wt. % nano-scale titanium carbide In addition to the foregoing data for the co-doped example $La_{0.15}Y_{0.05}Sr_{0.8}TiO_3$ alloy, the thermoelectric properties for $La_{0.05}Y_{0.05}Sr_{0.9}TiO_3$ were also evaluated. An analogous set of experiments were conducted resulting in densified, as-made (oxidized) material, material that was heat treated at 1400° C. for 6 hours in graphite, and material that was mixed with 5 wt. % nano-TiC and then heat treated at 1400° C. for 6 hours in graphite.

The same general trends are observed where electrical conductivity is significantly enhanced while thermal conductivity is decreased as a function of reduction. The thermoelectric figure of merit data are summarized in FIG. 4, which show that the material containing 5 wt. % TiC that was heat treated at 1400° C. exhibits a ZT value of about 0.23 at 1060K.

Figure 5:
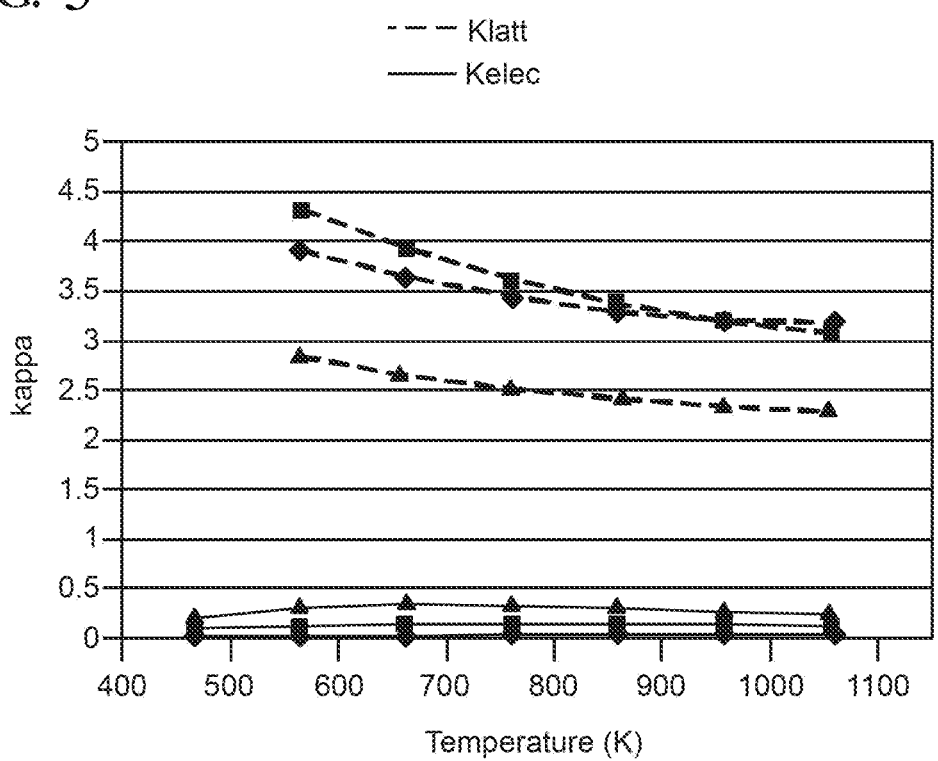
FIG. 5 is a plot of the electronic and lattice contributions to the thermal conductivity as a function of temperature for an example $SrTiO_3$-based thermoelectric material.

The effect of TiC addition on the thermal conductivity of the $La_{0.05}Y_{0.05}Sr_{0.9}TiO_3$ samples is seen in FIG. 5, where the electronic and lattice components of the total thermal conductivity are plotted. The lowest lattice thermal conductivity is exhibited by the TiC-containing material following the heat treatment at 1400° C. for 6 hours in graphite.

Figure 6:
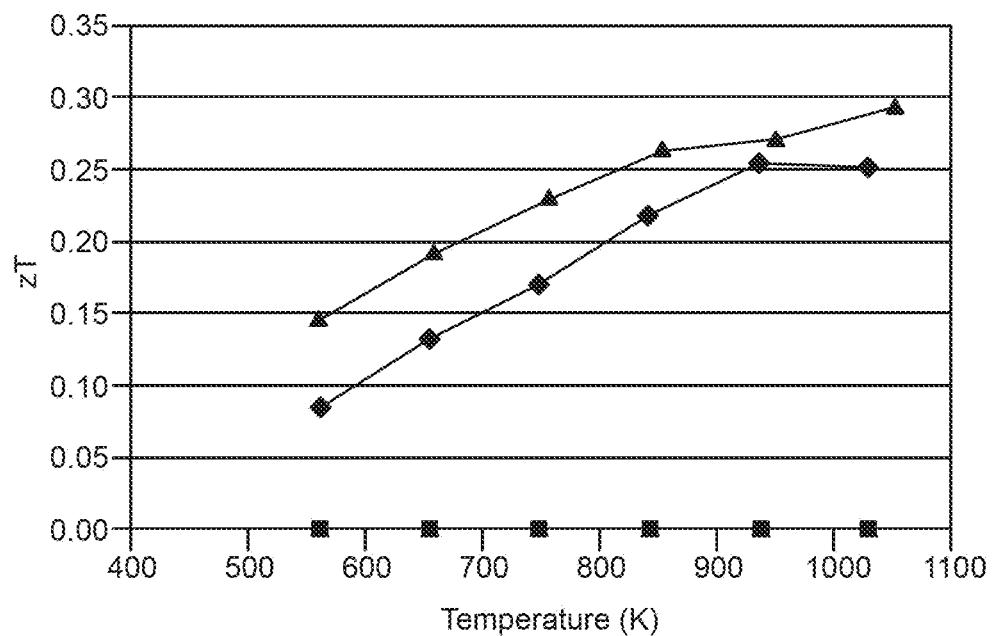
FIG. 6 is a plot of ZT versus temperature for still further comparative and example $SrTiO_3$-based thermoelectric materials.

In addition to the La, Y co-doped compositions, Nb-doped $SrTiO_3$ compositions were prepared and found to exhibit similar property enhancements when processed with TiC and a reducing heat-treatment. In various examples, the niobium is incorporated into the material on titanium lattice sites. FIG. 6 shows the ZT values as a function of temperature for a set of $Nb_{0.2}Ti_{0.8}SrO_3$ materials. The highest ZT is achieved by incorporating 5 wt. % TiC into the composition followed by a reducing heat treatment at 1400° C. for 6 hours in graphite. The electrical conductivity was increased relative to the as-made and reduced material while the thermal conductivity was decreased.

Due in part to their high figure of merit, high thermal shock resistance, thermal and chemical stability and relatively low cost, the disclosed thermoelectric materials can be used effectively and efficiently in a variety of applications, including automotive exhaust heat recovery. Though heat recovery in automotive applications involves temperatures in the range of about 400-750° C., the thermoelectric materials can withstand chemical decomposition in non-oxidizing environments or, with a protective coating, in oxidizing environments up to temperatures of 1000° C. or higher.

As disclosed herein, a method of making a thermoelectric material comprises mixing suitable starting materials, optionally heat treating or processing the starting materials at high temperature (greater than 900° C.) in air, and then heat treating the mixture in a reducing environment. In embodiments, doped $SrTiO_3$ starting materials (optionally including a reducing agent such as TiC) are prepared by turbula mixing of the appropriate oxides (and/or borides and/or nitrides and/or carbonates and/or individual elements), pressing the mixed materials into a die, and heating in air. For example, the pressing can be done in a 1.25 inch diameter die at about 4000 psi, following by heating in air at 1200° C. for 8 hours.

The resulting pellets can then be combined, re-homogenized by grinding, and pressed again into pellets, which can be heated (e.g., in air at 1200° C.). The resulting doped $SrTiO_3$ material can be reground and then reduced. As disclosed earlier, the act of reducing the thermoelectric material can comprise a heating step in graphite or, alternatively, incorporation of a reducing agent into the material followed by a heating step in graphite.

In one embodiment, pellets are cold-pressed and then buried in a bed of graphite. The assembly is placed into a furnace and heated, for example, at 1400° C. for 6 hours. After reduction, the material can be milled and sieved prior to densification. An example sieve size is 45 microns (or about 325 mesh).

In a further embodiment, nano-TiC or another nanoscale reducing agent can be mixed (e.g., turbula mixed) with the doped $SrTiO_3$ material prior to heating in the bed of graphite.

The prepared powders can be densified using spark plasma sintering (SPS). In an example method, a powder mixture can be placed into a graphite die, which is loaded into a Spark Plasma Sintering (SPS) apparatus where the powder mixture is heated and densified under vacuum and under applied pressure using a rapid heating cycle. Spark Plasma Sintering is also referred to as Field Assisted Sintering Technique (FAST) or Pulsed Electric Current Sintering (PECS). Other types of sintering can be used, such as HP or natural sintering in a reducing environment. Of course, other types of apparatus can be used to mix and compact the powder mixture. For example, powders can be mixed using ball milling or spray drying. Compaction of the mixture may be accomplished using a uniaxial or isostatic press.

Figure 7:
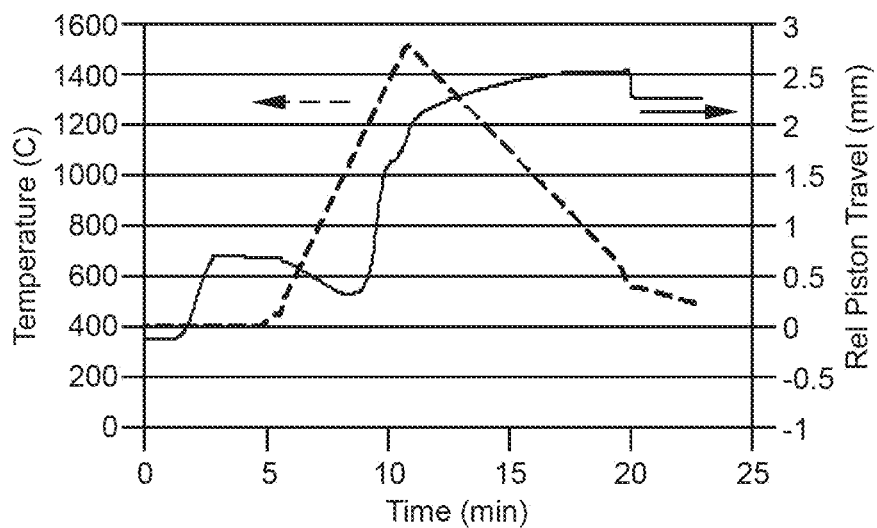
FIG. 7 is a plot of temperature and piston travel as a function of time according to an example densification method for forming thermoelectric materials according to various embodiments.
Figure 8:
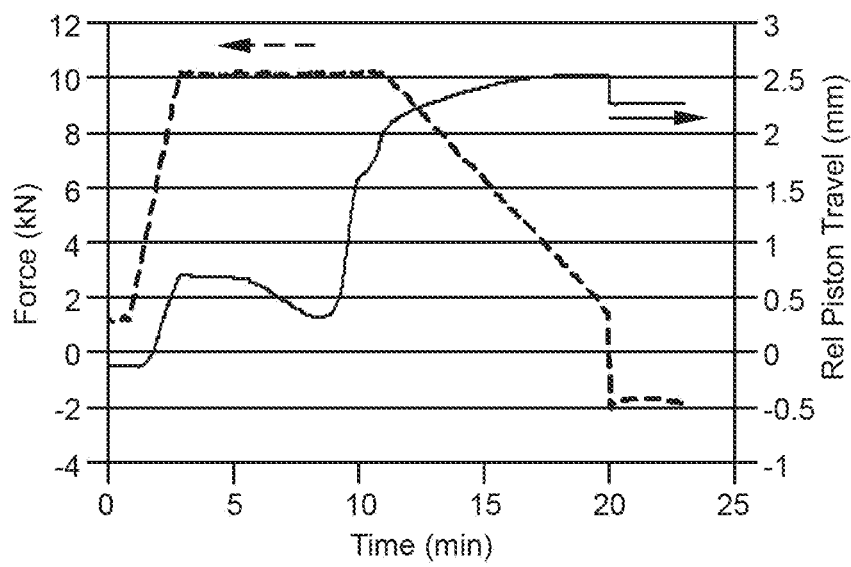
FIG. 8 is a plot of force and piston travel as a function of time for the data illustrated in FIG. 7.

Run data from a representative SPS sintering run are shown in FIGS. 7 and 8. In an example method, approximately 5 grams of material are densified using a 20 mm graphite die and piston assembly in the SPS apparatus. The compressed ceramics were found to be >98% dense.

Although FIG. 7 discloses a particular heating cycle, and FIG. 8 discloses a corresponding force profile, heating cycles with hold (maximum) temperatures of from about 900-1500° C. can be used in conjunction with heating rates from about 450° C. to the hold temperature of greater than 100° C./min (e.g., between about 100 and 400° C./minute), and hold times of from about 30 seconds to 10 minutes. A pressure of between about 3 to 60 MPa can be applied to the powder mixture to affect densification.

The electrical conductivity and Seebeck coefficient can show inverse responses to parameter changes. For example, an increase in the maximum SPS heating temperature increases the electrical conductivity but decreases the magnitude of the Seebeck coefficient. Faster heating rates and shorter dwell times also promote an increase in the magnitude of the Seebeck coefficient at lower electrical conductivity.

Thermoelectric properties were obtained from samples that were cut into coupons measuring 2-3 mm×2-3 mm×12-14 mm. Both the Seebeck coefficient and the electrical conductivity were measured simultaneously using a ULVAC-ZEM3 device from room temperature up to 800° C. The thermal conductivity was obtained at various temperatures from the product of the heat capacity and the thermal diffusivity, which were determined using a thermal property analyzer (Anter Corp., Pittsburg, Pa.) and the bulk density of the material.

Table 1 lists several exemplary doped and co-doped $SrTiO_3$-based thermoelectric compositions that were reduced and evaluated according to the processing methods disclosed herein. Omitted from the compositional data listed in Table 1 is presence in some samples of titanium carbide or other reducing agent, which may be added to the composition before or after a thermal reduction step in graphite.

TABLE 1

Example doped and co-doped thermoelectric oxide compositions

| | $(La_xY_ySr1 - x - y)1 -$ | | | | ZT at 1050K | | |
| | $zTi1 + zO3$ | | | | | | 5 wt % TiC + |
| No. | (x + y) | x | y | z | As Made | Reduced | Reduced |
|---|---|---|---|---|---|---|---|
| A | 0.05 | 0.025 | 0.025 | 0 | 0.06 | 0.14 | 0.17 |
| B | 0.10 | 0.100 | 0.000 | 0 | 0.01 | 0.16 | 0.19 |
| C | 0.10 | 0.000 | 0.100 | 0 | 0.14 | | 0.20 |
| D | 0.10 | 0.050 | 0.050 | 0 | 0.03 | 0.11 | 0.28 |
| E | 0.20 | 0.100 | 0.100 | 0 | 0.02 | 0.10 | 0.30 |
| F | 0.20 | 0.150 | 0.050 | 0 | 0.07 | 0.15 | 0.30 |
| G | 0.25 | 0.150 | 0.100 | 0 | | 0.24 | 0.24 |
| H | 0.20 | 0.150 | 0.050 | 0.040 | | 0.01 | |
| I | 0.20 | 0.150 | 0.050 | 0.055 | | 0.05 | |
| J | 0.20 | 0.150 | 0.050 | 0.078 | | 0.21 | |
| K | 0.20 | 0.150 | 0.050 | 0.090 | | 0.25 | |
| L | 0.20 | 0.150 | 0.050 | 0.110 | | 0.18 | |

* the as-made samples are un-reduced and comparative.

The highest ZT at 1050K of 0.30 was obtained with Composition E, $La_{0.1}Y_{0.1}Sr_{0.8}TiO_{3-\delta}$+5 wt. % TiC, and Composition F, $La_{0.15}Y_{0.05}Sr_{0.8}TiO_{3-\delta}$+5 wt. % TiC. Compositions H-L are based on Composition F with excess titanium oxide batched before the calcination process step (z>0). The maximum ZT at 1050K=0.25 was obtained at z=0.09, Composition K.

In embodiments, calcium was used as a light homovalent dopant. Ca-doped samples were prepared via the addition of calcium carbonate to the batch to produce Ca dopant levels of x=0.1, 0.2 and 0.3 in $La_{0.15}Y_{0.05}Ca_xSr_{0.8}TiO_{1-\delta}$. Samples were prepared with and without the addition of 5 wt. % TiC.

For samples without the TiC addition, the power factor (and ZT) decreased with Ca-doping, primarily due to a decrease in electrical conductivity. For samples with the TiC addition, however, the power factor increased with Ca-doping. The lattice thermal conductivity decreased with increasing Ca at temperatures less than about 850K. ZT values of these materials was greater than 0.2 at 1050K.

The microstructure of the calcium-doped samples included at least a La, Sr titanate phase and a Ti-rich phase, with the Ca distributed throughout the titanate phase. A ZT value of 0.27 at 860K was measured for $(La_{0.15}Y_{0.05})Ca_{0.3}Sr_{0.5}TiO_{3-\delta}$.

In embodiments, the disclosed thermoelectric materials have an electrical conductivity greater than $10^3$ S/m, a Seebeck coefficient (absolute value) greater than 100 μV/K, and a thermal conductivity κ over a temperature range of 400-1200K of less than 6 W/mK. By way of example, the electrical conductivity can be greater than $10^3$, $2\times10^3$, $3\times10^3$, $4\times10^3$, $5\times10^3$, $6\times10^3$, $7\times10^3$, $8\times10^3$, $9\times10^3$, $10^4$, $2\times10^4$, $3\times10^4$, $4\times10^4$, $5\times10^4$, $6\times10^4$, $7\times10^4$, $8\times10^4$, $9\times10^4$ or $10^5$ S/m, the absolute value of the Seebeck coefficient can be greater than 100, 150, 200, 250, 300 or 350 μV/K, and the thermal conductivity over the range of 400-1200K can be less than 6, 5.5, 5, 4.5, 4, 3.5, 3, 2.5, 2 or 1.5 W/mK. Further, the electrical conductivity, Seebeck coefficient and thermal conductivity may have values that extend over a range where the minimum and maximum values of the range are given by the values above. For example, a thermoelectric material that has an electrical conductivity greater than $10^3$ S/m can also be defined as having an electrical conductivity between $2\times10^4$ and $10^5$ S/m.

Recalling that the power factor is defined as $PF=\sigma S^2$, and the figure of merit is defined as $ZT=\sigma S^2 T/\kappa$, according to embodiments the disclosed thermoelectric material has a power factor times temperature at 1000 K greater than about 0.1 W/mK (e.g., greater than 0.1, 0.2, 0.3, 0.4, 0.5, 0.6, 0.7, 0.8, 0.9, 1.0, 1.1, 1.2 or 1.3 W/mK) and a figure of merit at 1000K greater than about 0.2 (e.g., greater than 0.2, 0.25, 0.3 or 0.35). Further, values of power factor times temperature and figure of merit may extend over a range where the minimum and maximum values of the range are given by the values above.

The thermoelectric figure of merit for the doped, partially-reduced thermoelectric oxide materials disclosed herein is at least 0.01 at 1050K (e.g., at least 0.01, 0.05, 0.1, 0.15, 0.2, 0.25 or 0.3 at 1050K).

In further examples, dense, polycrystalline ceramics were prepared from mixtures of dry $SrCO_3$, $La_2O_3$, $Y_2O_3$, $TiO_2$ and $Ti_2O_3$ powders. The powders were turbula-mixed and cold-pressed into pellets which were calcined at 1200° C. for 12 hours in air, milled, then re-calcined under the same conditions and re-milled. In some cases, an additive such as TiC (Sigma Aldrich, <200 nm), TiN (Sigma Aldrich, <3 microns) or $TiB_2$ (NaBond, ~60 nm) was mixed into the calcined powder.

Cold-pressed pellets were buried in a graphite bed formed from a silica crucible filled with graphite powder. The assembly was heated to 1400° C. in an air atmosphere and held for 6 hours. The reduced materials were milled and sieved to about 325 mesh. Powders were sintered in a 20 mm-diameter graphite die using spark plasma sintering. The maximum temperature and hold time were 1500° C. for 15 sec with an applied force of 11 kN.

Polished samples for analysis were prepared from the sintered parts. Electrical conductivity and Seebeck coefficients were measured from room temperature to 800° C. in a helium atmosphere using an ULVAC-ZEM3 instrument. Thermal diffusivity (D) and heat capacity ($C_p$) were measured at various temperatures over the same temperature range using the laser flash method. Thermal conductivity was calculated from the product of these measurements and density ($\rho$) using the relationship $K(T)=D(T)C_p(T)\rho(T)$.

Figure 9:
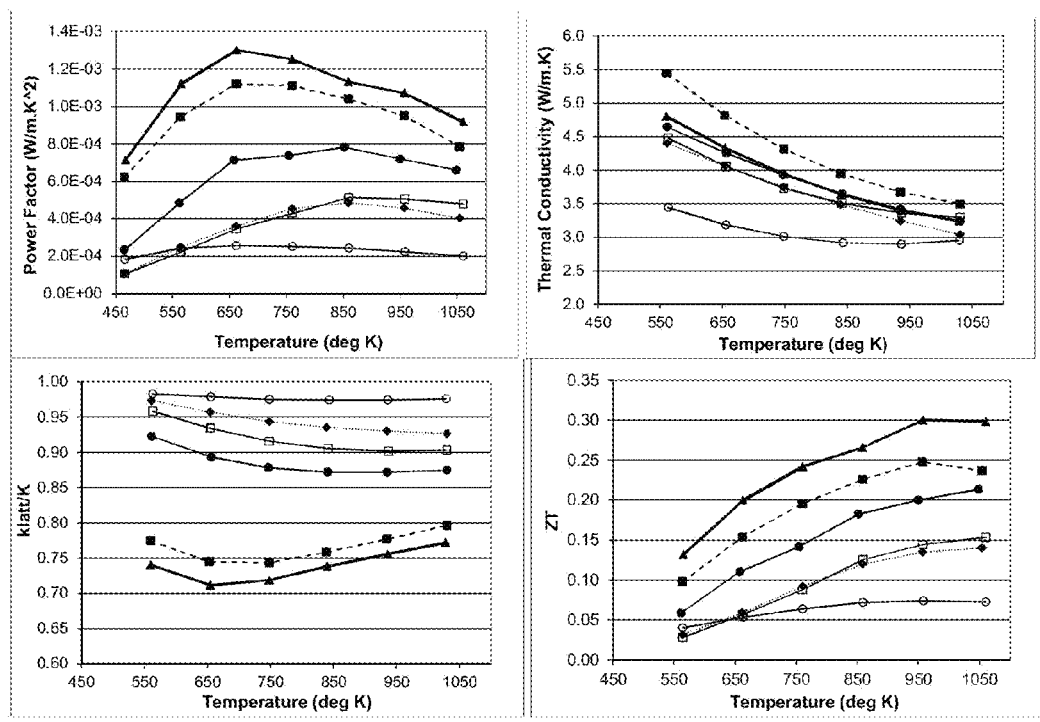
FIG. 9 is a plot of additional thermoelectric data versus temperature for Composition F (TiC addition)

FIG. 9 shows plots of $k_{latt}/K$ as a function of temperature for Composition F as-made (open circles), reduced (open squares), and with different levels (1.5, 3.5, 5 and 7 wt. %) of TiC added. In FIG. 9, the 1.5 wt. % TiC data are illustrated as diamonds, 3.5 wt. % TiC as squares, 5 wt. % as triangles and 7 wt. % as circles. For the as-made material, $k_{latt}/K$ was close to unity. The ratio decreased with reduction and with TiC additions of 3.5-7 wt. %. The ratio was lowest for 5 wt. % TiC over the entire temperature range explored. At 1050K, $k_{latt}/K=0.77$. ZT and the PF were maximized at this composition as well with ZT(1050K)=0.30.

Figure 10:
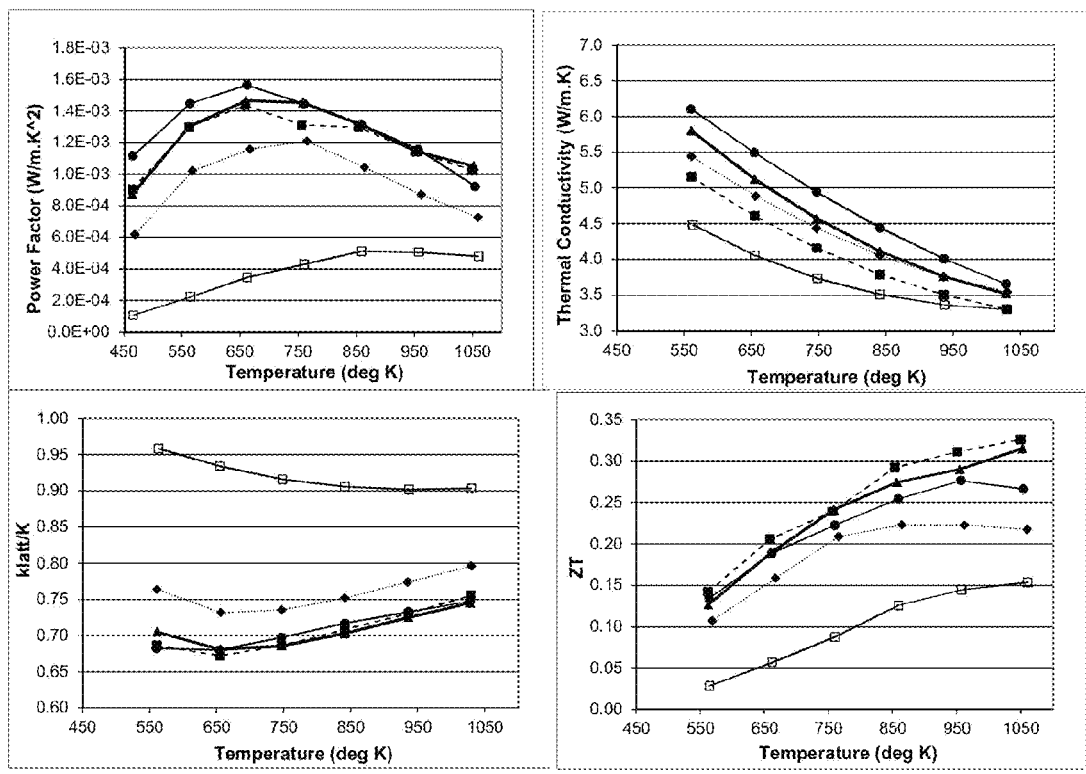
FIG. 10 is a plot of thermoelectric data versus temperature for Composition F ($TiB_2$ addition)
Figure 11:
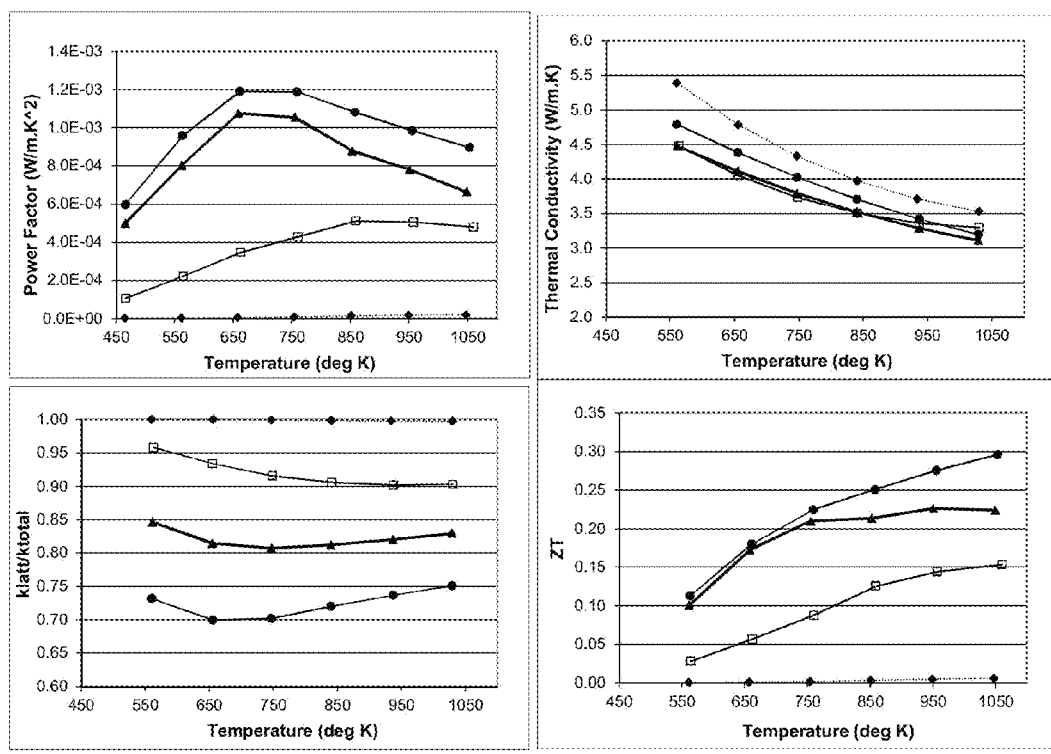
FIG. 11 is a plot of thermoelectric data versus temperature for Composition F (TIN addition)

TiB$_2$ and TiN additions were found to have an effect similar to TiC. Composition F was prepared with 1.7, 3, 6, and 8 wt. % TiB$_2$ and with 1.5, 5, and 7 wt. % TiN. Thermoelectric properties as a function of temperature are shown in FIGS. 10 and 11, respectively. In FIG. 10, reduced samples are shown as open squares, 1.7 wt. % TiB$_2$ are illustrated as diamonds, 3 wt. % TiB$_2$ as squares, 6 wt. % TiB$_2$ as triangles and 8 wt. % TiB$_2$ as circles. In FIG. 11, reduced samples are shown as open squares, 1.5 wt. % TiN are illustrated as diamonds, 5 wt. % TiN as triangles and 7 wt. % TiN as circles.

Decreases in $k_{latt}/K$ and increases in PF and ZT over that of the Composition F reduced material from 550 to 1050K were obtained with both additives. This effect was obtained with 5 wt. % TiN, but only 1.7 wt. % TiB$_2$ was needed. The highest ZT at 1050K achieved with TiB$_2$ was 0.33 (3 wt. %) and with TiN was 0.30 (7 wt. %). These compositions also gave the lowest $k_{latt}/K$ at 1050K, 0.75.

Figure 12:
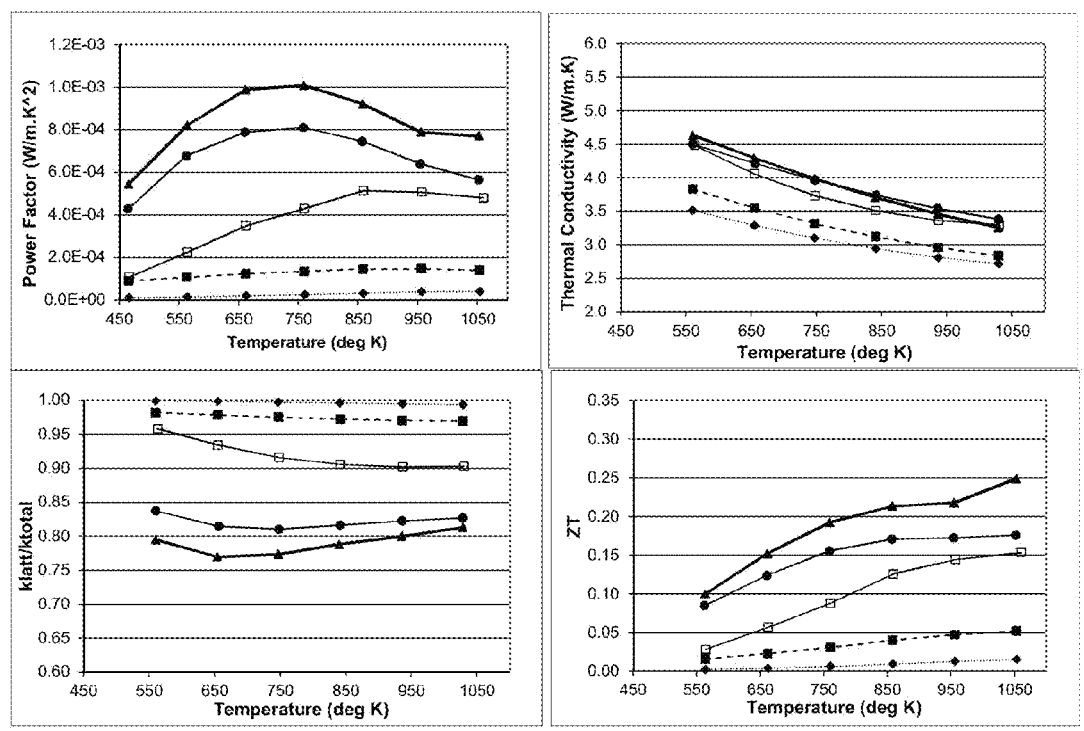
FIG. 12 is a plot of additional thermoelectric data versus temperature for Compositions F, and H-L.

FIG. 12 shows the thermoelectric properties of Compositions F (open squares), H (diamonds), I (squares), K (triangles) and L (circles) as a function of temperature. A decrease in $k_{latt}/K$ over that of the stoichiometric Composition F and increases in PF and ZT were observed from 550 to 1050K for Compositions K and L. The lowest $k_{latt}/K$, 0.81, and the highest PF and ZT at 1050K were obtained for Composition K (z=0.09). For this material, ZT (1050K)= 0.25.

The microstructures of the materials were examined by SEM and EDX. Scanning electron microscopy (SEM) images and energy dispersive x-ray (EDX) spectra of polished samples of the sintered materials were taken using a Hitachi SU-70 FESEM with an OXFORD Inca EDX system.

Figure 13:
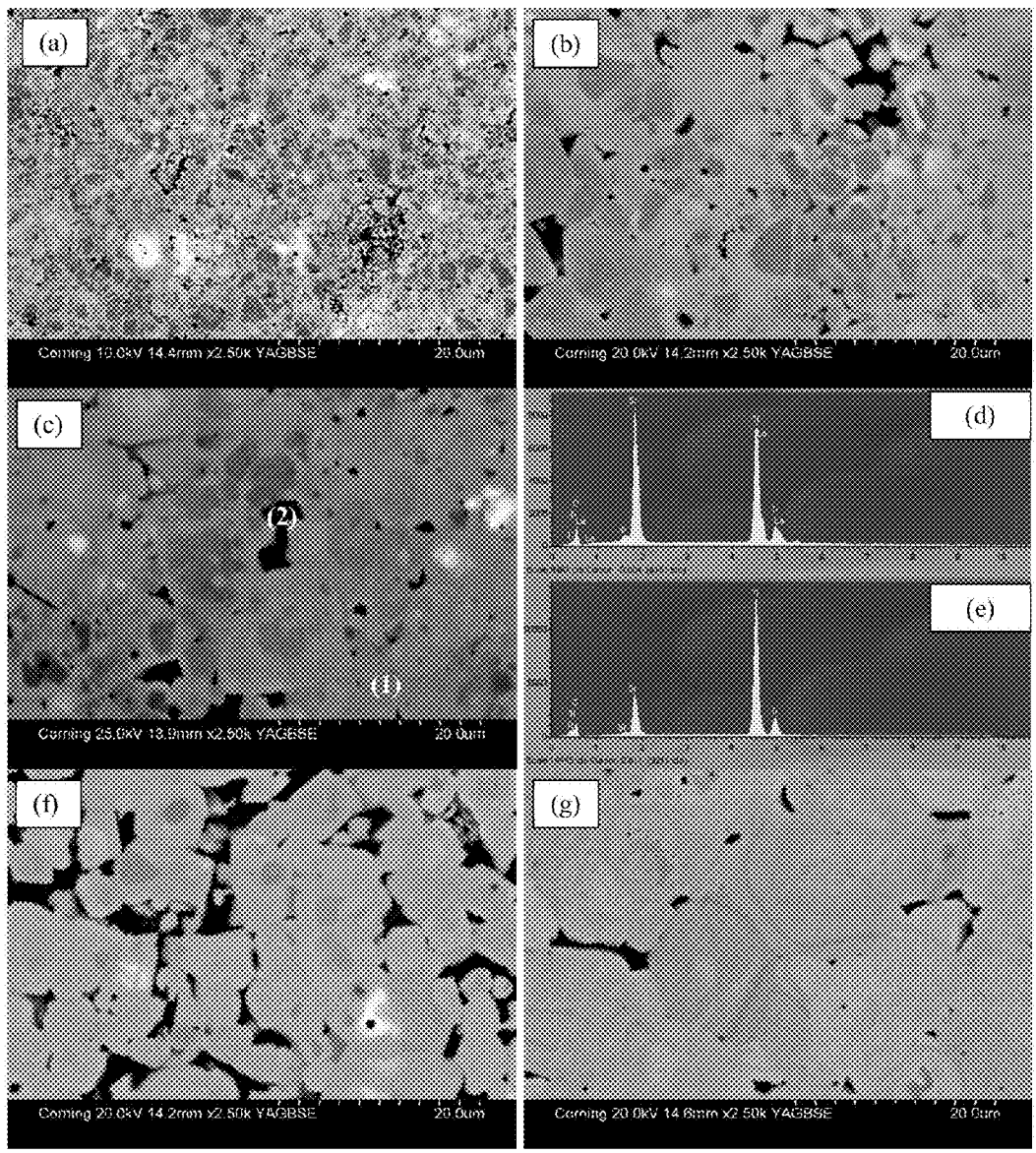
FIG. 13(a)-(g) shows SEM and EDX data for several example thermoelectric materials.

FIG. 13 shows backscattered electron images of (a) Composition F reduced, (b) Composition K reduced, and Composition F with (c) 5 wt. % TiC, (f) 5 wt. % TiN, and (g) 5 wt. % TiB$_2$ additions. FIGS. 13(d) and (e) shows EDX spectra for region 1 (matrix phase) and region 2 (dark phase) in FIG. 13(c). Both the addition of excess titania (FIG. 13b) and the TiX additives (FIGS. 13c, f, g) produced a large increase in grain size, from ≤5 microns to ≤20 microns, compared to the reduced stoichiometric material without additives (FIG. 13a).

All of the materials were compositionally inhomogeneous as shown by the variations in gray level in the images. The matrix grains were determined to be La,Y-strontium titanate (see EDX spectrum, FIG. 13d). The gray level gradation within the grains from dark gray to white indicates an increasing level of La enrichment. Areas of Y enrichment were also present. The black intergranular phase was identified as a titania-rich phase. In the excess titania (FIG. 13b) and TiC (FIG. 13c) materials, this phase has been identified as a titanate phase containing lower levels of strontium (see EDX spectrum, FIG. 13e). The TiN material (FIG. 13f) had a similar microstructure with more of the dark intergranular phase. In contrast, the TiB$_2$ material (FIG. 13g), appeared much more homogeneous, exhibiting less gray level variation within the matrix grains.

In various embodiments, co-doping with La and Y and the introduction of a TiX (X=N, C, B$_2$) additive was shown to be more effective at improving the thermoelectric properties of strontium titanate than single element doping or co-doping with reduction alone. All of the additives produced increased electrical conductivities and power factors while suppressing lattice thermal conductivity.

An impact of the additives is to lower pO$_2$ within the graphite bed during the reduction step. This effect can be shown through thermodynamic calculations. Here, the reaction between TiO$_x$, TiN, TiC, TiB$_2$ and pure CO(g) at 1400° C. are considered. Only pure phases (gases, liquids, solids) were included in the calculations. The results are shown in Table 2. A difference of several orders of magnitude in pO$_2$ is observed between TiO$_2$ and the TiX compounds, for which pO$_2$ hardly varies with CO:TiX.

Thus at 1400° C., pO$_2$ (TiB$_2$)≤pO$_2$ (TiC)<pO$_2$ (TiN)<< pO$_2$ (TiO$_2$).

TABLE 2

Thermodynamic calculations of pO$_2$ for TiO$_2$, TiN, TiC, and TiB$_2$ in equilibrium with CO(g) at T = 1673K, P(total) = 1 atm.

| INPUTS (moles) | 0.1 CO(g) | 1 CO(g) | 5 CO(g) | 10 CO(g) |
|---|---|---|---|---|
| 1 TiO2 | 2.4E-11 | 6.6E-12 | 1.2E-12 | 5.9E-13 |
| 1 TiN | 1.6E-16 | 1.6E-16 | 1.6E-16 | 1.6E-16 |
| 1 TiC | 7.3E-17 | 7.3E-17 | 7.3E-17 | 7.3E-17 |
| 1 TiB2 | 3.5E-17 | 3.5E-17 | 7.3E-17 | 7.3E-17 |

The additives create a more reducing environment than the graphite bed alone and can, therefore, be termed "reducing agents." The electrical conductivity of SrTiO$_3$ has been shown to increase with decreasing pO$_2$ through the formation of oxygen vacancies and Ti$^{+3}$. The addition of these reducing agents produced higher electrical conductivities and power factors than the graphite bed atmosphere alone, consistent with lower pO$_2$ during synthesis.

This increase in electrical conductivity was not accompanied by a proportional increase in thermal conductivity. The additives, therefore, play a second role of suppressing the lattice component of thermal conductivity. It is possible that oxygen vacancies induced by reduction increase the phonon scattering in the crystal lattice. Alternatively, the additives could act as a source of excess titania. Excess TiO$_2$ dissolved in the strontium titanate crystal would produce oxygen vacancies and Sr-site vacancies which, again, could act as phonon scatterers. When excess titania was batched into the La+Y co-doped strontium titanate, lower $k_{latt}/K$ and higher power factors were obtained. Since the Ti$_2$O$_3$ was batched before the calcination step, it was most likely oxidized and would not have contributed to the reduction of the material during subsequent process steps as the TiX reducing agents would. The actual compositions of the strontium titanate materials were not measured.

In the present study, the grain sizes of materials with TiN, TiC, TiB$_2$ and excess titania additions that showed improved thermoelectric properties all had significantly larger grain sizes than the "stoichiometric" reduced material.

In addition to creating point defects, excess titania can lead to the formation of other phases. The Sr—Ti—O phase diagram shows a region of limited Ti solubility in SrTiO$_3$. Beyond this solubility range, equilibrium phase assemblages of SrTiO$_3$ (ss), TiO$_2$, Magneli phases (Ti$_n$O$_{2n-1}$), and other reduced titania compounds are predicted to form depending on the level of oxygen deficiency. SEM micrographs of materials in the present study did reveal multiphase microstructures including grains of La, Y strontium titanate and a titania-rich phase containing strontium.

The lack of TiN, TiC or TiB$_2$ detectable by XRD in the materials can be explained using thermodynamic calculations. In addition to producing lower pO$_2$, the calculations show that all three additives can be partially or fully converted to reduced titania, TiC, and carbon in the presence of CO(g) during the reduction step. In the case of TiB$_2$, gaseous and liquid boron oxide phases may also form. While no TiC or carbon was apparent in the SEM images, TEM examination of Composition F with 5 wt. % TiC did reveal small regions of TiC at triple junctions between grains. Such nanophases would not be detected by XRD, but could act as phonon scatterers, thereby reducing the lattice thermal conductivity.

Finally, some mention of the differences in the amounts of the reducing agent needed to achieve beneficial effects can be made. Addition levels which were effective at lowering $k_{latt}/K$ (and increasing PF and ZT) were lower for TiB$_2$ than TiC, which were in turn lower than TiN. This minimum addition level correlates with their ability to decrease pO$_2$. That is, TiB$_2$ is more effective at reducing pO$_2$ than TiC which is more effective than TiN. An alternative explanation can be made based on the difference in particle sizes between the additives. The TiN powder was <3 microns, TiC<0.3 microns, and the TiB$_2$ ~60 nm. These size differences may have affected the extent of reaction and interdiffusion within the powder compacts during the reduction and sintering steps. Indeed, the TiB$_2$ material did appear more homogeneous than the other materials at all addition levels.

The addition of a reducing agent during powder processing has been shown to improve the high temperature (550-1050K) thermoelectric properties of bulk, polycrystalline La,Y-doped strontium titanate ceramics. TiC, TiN, LaB$_6$ and TiB$_2$ were all shown to be effective for increasing the power factor (and ZT) while simultaneously suppressing the lattice thermal conductivity. Their effect may be attributed to increased charge carrier concentrations due to lower pO$_2$ during processing, the generation of point defects and secondary phases. Using these additives, the lattice component of the thermal conductivity was reduced from 97% of the thermal conductivity to 75% at 1050K. Materials with ZT up to 0.33 at 1050K were produced using this process.

The thermoelectric effects of niobium doping were evaluated via the addition of niobium carbide (NbC) to La$_{0.15}$Y$_{0.05}$TiO$_3$. Additions of 2, 4 and 8.5 wt. % (3.6, 7.1 and 14.5 mol %) NbC particles (particle size<10 microns) were made to La$_{0.15}$Y$_{0.05}$TiO$_3$ after calcination but prior to reduction. A decrease in the power factor relative to samples containing no NbC was measured for all niobium carbide additions. The maximum ZT for the Nb-doped samples was <<0.1.

The thermoelectric effects of LaB$_6$ were evaluated via the addition of LaB$_6$ powder (3.2 and 6.4 wt. %) to calcined La$_{0.15}$Y$_{0.05}$TiO$_3$ powder. The power factor for both LaB$_6$ additions was about $1.2 \times 10^{-3}$ W/mK$^2$ at 760K, which compared favorably to the power factor at 760K for no LaB$_6$ addition ($4 \times 10^{-4}$ W/mK$^2$). The effect of 3.2 or 6.4 wt. % LaB$_6$ on the power factor was comparable to the effect of 3 wt. % TiB$_2$, though TiB$_2$ had a stronger influence on the suppression of the lattice thermal conductivity. The maximum ZT for the LaB$_6$-containing samples was 0.25 at 1050K. LaB$_6$ is effective at increasing ZT of La,Y co-doped strontium titanate.

Materials of interest, in accordance with the foregoing, include a doped, partially-reduced, calcium-containing thermoelectric oxide material represented by a formula: (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth or alkaline earth elements and at least one of D1 and D2 comprises Ca, and wherein 0≤x≤0.4, 0≤y≤0.4, 0.025≤(x+y)≤0.4, 0≤z≤0.15, and further wherein m defines an oxygen non-stoichiometry with 0≤m≤0.1, and further comprising at least one second phase selected from the group consisting of LaB$_6$, TiC, TiN, TiO$_x$ (x≤2) and TiB$_2$. Such materials can have a thermoelectric figure of merit for the material at 1050K of greater than 0.2. In embodiments, the material is co-doped. In embodiments, the material further comprises from about 0.25 to 10 wt. % LaB$_6$, TiC, TiN, and/or TiB$_2$. In embodiments, the material can have a thermal conductivity of less than 6 W/m-K over a temperature range of 400-1200K. A thermoelectric device can beneficially comprise the material.

According to a process embodiment, there is provided a method of making a doped, partially-reduced, calcium-containing thermoelectric oxide material, the method comprising combining raw materials to form a mixture, surrounding the mixture with graphite, and heating the mixture to form a partially-reduced thermoelectric oxide material, wherein the thermoelectric oxide material is represented by a formula (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth elements and alkaline earth elements and at least one of D1 and D2 comprises Ca, such that 0≤x≤0.4, 0≤y≤0.4, 0.025≤(x+y)≤0.4, 0≤z≤0.15, and further wherein m defines an oxygen non-stoichiometry with 0≤m≤0.1, and wherein the material further comprises at least one second phase selected from the group consisting of LaB$_6$, TiC, TiN, TiO$_x$(x ≤2) and TiB$_2$. In embodiments, the combining can be done in air at a temperature of at least 900°C. In embodiments, the combining comprises forming the mixture of raw materials into a pellet. In embodiments, the raw materials comprise elements and/or compounds. In embodiments, the raw materials comprise oxides. In embodiments, the raw materials comprise borides. In embodiments, the raw materials include a reducing agent. In embodiments, the heating temperature ranges from 1200 to 1800°C.

Another material embodiment is a doped, partially-reduced, LaB$_6$-containing thermoelectric oxide material represented by a formula (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth or alkaline earth elements and wherein 0≤x≤0.4, 0≤y≤0.4, 0.025≤(x+y)≤0.4, 0≤z≤0.15, and wherein m defines an oxygen non-stoichiometry with 0≤m≤0.1, and further comprising at least one second phase selected from the group consisting of TiC, TiN, TiO$_x$ (x≤2) and TiB$_2$.

As used herein, the singular forms "a," "an" and "the" include plural referents unless the context clearly dictates otherwise. Thus, for example, reference to "an oxide" includes examples having two or more such "oxides" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

What is claimed is:

1. A doped, partially-reduced, calcium-containing thermoelectric oxide material represented by a formula:
    (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth or alkaline earth elements, wherein at least one of D1 and D2 comprises Ca; and wherein
    0≤x≤0.4, 0≤y≤0.4, 0.025≤(x+y)≤0.4, 0≤z≤0.15, and m defines an oxygen non-stoichiometry with 0≤m≤0.1, and further comprising at least one second phase selected from the group consisting of LaB$_6$, TiC, TiN, TiO$_x$ (x≤2) and TiB$_2$.

2. The doped, partially-reduced thermoelectric oxide material according to claim 1, wherein a thermoelectric figure of merit for the material at 1050K is greater than 0.2.

3. The doped, partially-reduced thermoelectric oxide material according to claim 1, wherein the material is co-doped.

4. The doped, partially-reduced thermoelectric oxide material according to claim 1, further comprising from about 0.25 to 10 wt. % LaB$_6$, TiC, TiN, and/or TiB$_2$.

5. The doped, partially-reduced thermoelectric oxide material according to claim 1, wherein a thermal conductivity of the material is less than 6 W/m-K over a temperature range of 400-1200K.

6. A thermoelectric device comprising the doped, partially-reduced thermoelectric oxide material according to claim 1.

7. A method of making a doped, partially-reduced, calcium-containing thermoelectric oxide material, said method comprising:
    combining raw materials to form a mixture,
    surrounding the mixture with graphite; and
    heating the mixture to form a partially-reduced thermoelectric oxide material, wherein the thermoelectric oxide material is represented by a formula:
    (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth elements and alkaline earth elements and at least one of D1 and D2 comprises Ca; such that 0≤x≤0.4, 0≤y≤0.4, 0.025≤(x+y)≤0.4, 0≤z≤0.15, and m defines an oxygen non-stoichiometry with 0≤m≤0.1, and the material further comprises at least one second phase selected from the group consisting of LaB$_6$, TiC, TiN, TiO$_x$ (x≤2) and TiB$_2$.

8. The method according to claim 7, wherein the combining is done in air at a temperature of at least 900° C.

9. The method according to claim 7, wherein the combining comprises forming the mixture of raw materials into a pellet.

10. The method according to claim 7, wherein the raw materials comprise elements and/or compounds.

11. The method according to claim 7, wherein the raw materials comprise oxides.

12. The method according to claim 7, wherein the raw materials comprise borides.

13. The method according to claim 7, wherein the raw materials include a reducing agent.

14. The method according to claim 7, wherein the heating temperature ranges from 1200 to 1800° C.

15. A doped, partially-reduced, LaB$_6$-containing thermoelectric oxide material represented by a formula:
    (Sr$_{1-x}$D1$_x$)$_{1-z}$(Ti$_{1-y}$D2$_y$)Ti$_z$O$_{3-m}$, where D1 and D2 each represent one or more dopant atoms selected from the group consisting of Ca, Ce, Nb, Ta, La, Y, and other rare earth or alkaline earth elements; wherein
    0≤x≤0.4, 0≤y≤0.4, 0.025≤(x+y)≤0.4, 0≤z≤0.15, and m defines an oxygen non-stoichiometry with 0≤m≤0.1, and further comprising at least one second phase selected from the group consisting of TiC, TiN, TiO$_x$ (x≤2) and TiB$_2$.

* * * * *